United States Patent [19]

Hidler et al.

[11] 4,415,427

[45] Nov. 15, 1983

[54] THIN FILM DEPOSITION BY SPUTTERING

[75] Inventors: Henry T. Hidler, Danvers; Lawrence L. Hope, Stow; Ernest A. Davey, Peabody, all of Mass.

[73] Assignee: GTE Products Corporation, Stamford, Conn.

[21] Appl. No.: 431,957

[22] Filed: Sep. 30, 1982

[51] Int. Cl.³ ............................................. C23C 15/00
[52] U.S. Cl. ................................. 204/298; 204/192 R
[58] Field of Search ............................ 204/298, 192 R

[56] References Cited

U.S. PATENT DOCUMENTS

| | | | |
|---|---|---|---|
| 3,530,057 | 9/1970 | Muly | 204/298 |
| 3,878,085 | 4/1975 | Corbani | 204/298 |
| 3,956,093 | 5/1976 | McCleod | 204/298 |
| 4,025,410 | 5/1977 | Stewart | 204/298 |
| 4,094,764 | 9/1978 | Boucher et al. | 204/298 |
| 4,166,018 | 8/1979 | Chapin | 204/192 R |
| 4,180,450 | 12/1979 | Morrison | 204/298 |
| 4,194,962 | 3/1980 | Chambers et al. | 204/298 |
| 4,303,489 | 1/1981 | Morrison | 204/298 |

*Primary Examiner*—Arthur P. Demers
*Attorney, Agent, or Firm*—Edward J. Coleman

[57] ABSTRACT

The deposition of thin films is carried out by a co-sputtering cathode technique particularly suited for deposition of doped thin films on large area substrates. A relatively large planar magnetron sputtering apparatus having a rectangular (picture frame shaped) plasma region is provided to obtain efficient sputtering of the host material. A vacant center area defined by the plasma region is provided for diode sputtering of the dopant. In RF sputtering, co-excitation of the power source is desired to prevent RF mode beating.

9 Claims, 3 Drawing Figures

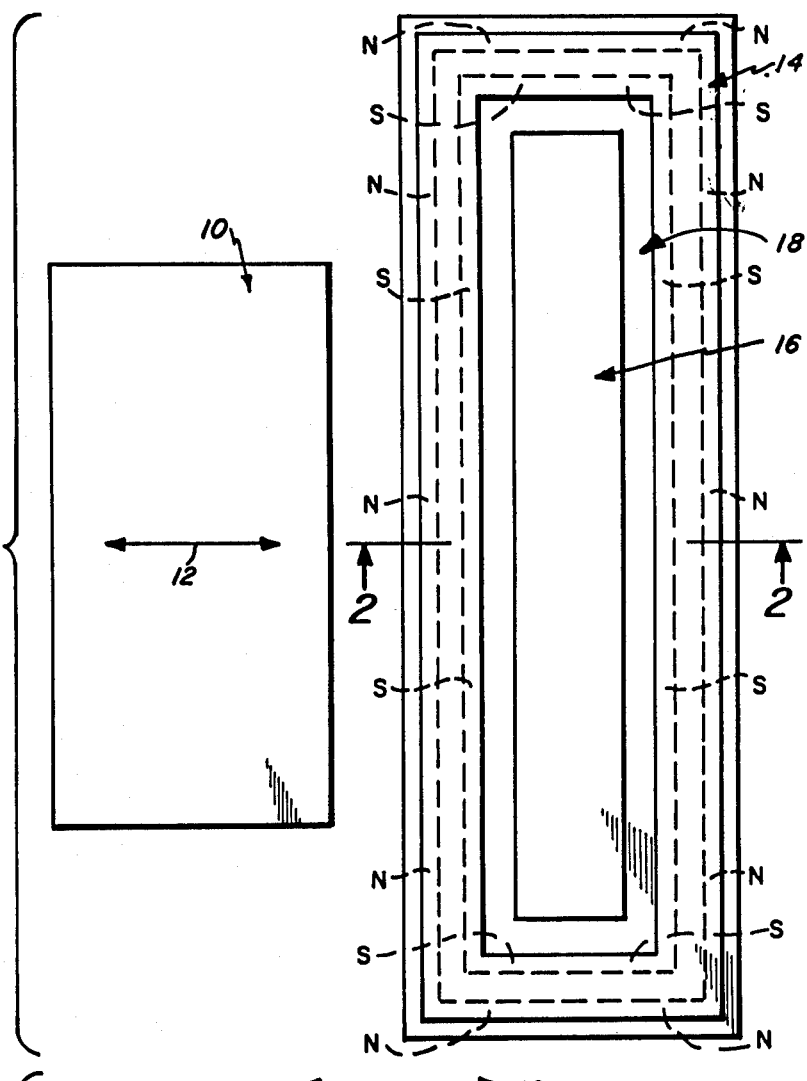
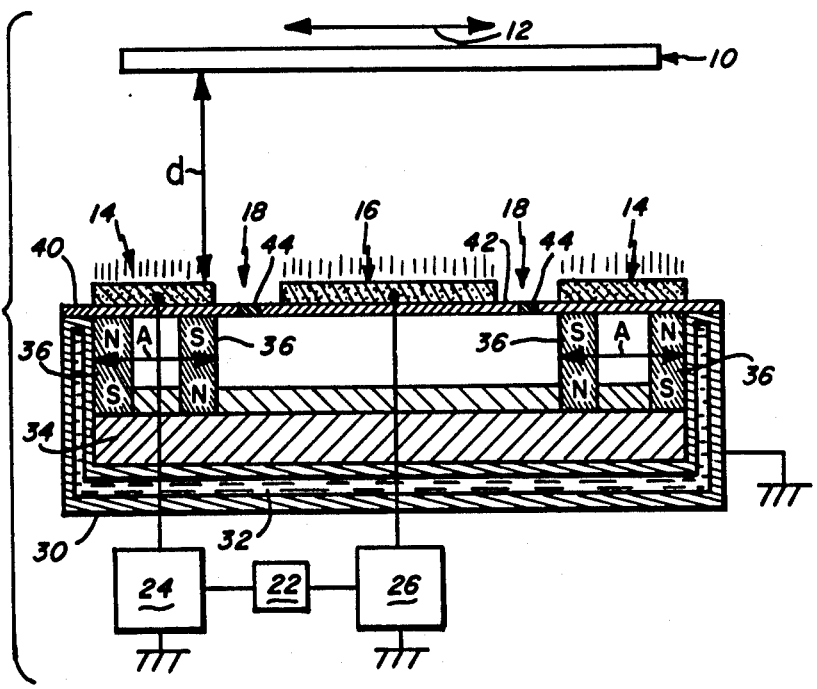
Fig.1
Fig.2

4,415,427

THIN FILM DEPOSITION BY SPUTTERING

The government has rights in this invention pursuant to Contract No. DAAK20-81-C-0433 awarded by the Department of the Army.

BACKGROUND OF THE INVENTION

The present invention relates in general to a thin film deposition technique employing cathode sputtering, and pertains, more particularly to a co-sputtering cathode system or apparatus for the deposition of doped thin films particularly on large area substrates.

Planar magnetron sputtering has been used as a general purpose technique for the deposition of thin films in both laboratory and production applications. An advantage of planar magnetron sputtering is that it permits relatively high rates of deposition, limits unwanted substrate bombardment and heating, and is particularly adapted for use with large flat substrates without requiring special planetary tooling or excessively large throw distances. Planar magnetron sputtering is characterized by a visible plasma area magnetically confined to a selected region or regions of the cathode which are the only areas with significant emission of sputtered material. The emitting areas or zones assume the form of closed figures in the target plane.

For many applications it is desired to deposit doped films on large area substrates with close control of both uniformity and dopant level. The deposition of doped films has involved the use of a doped target. However, techniques involving doped targets are subject to variations in consistancy of the deposited film particularly over a time span due to concentration or depletion of dopant in the target. Additional disadvantages associated with doped targets are that they may be difficult or impossible to fabricate and that there is a loss in flexibility in changing dopant material or doping level.

SUMMARY OF THE INVENTION

Accordingly, it is an object of the present invention to provide an improved sputtering cathode apparatus or system for the deposition of doped thin films particularly on large area substrates.

Another object of the present invention is to provide an improved planar magnetron sputtering apparatus for the deposition of doped films and in which the deposition is to be closely controlled both as to uniformity thereof and dopant level.

A further object of the present invention is to provide a co-sputtering cathode system particularly adapted for the deposition of doped thin films on large area substrates and without requiring the use of a doped target. By eliminating the necessity of a doped target in accordance with the present invention there is also eliminated variations that occur in such doped target deposition films due to concentration or depletion of dopant in the target.

Still another object of the present invention is to provide a planar magnetron sputtering apparatus in which the dopant level may be precisely and uniformly controlled.

Another object of the present invention is to provide an improved planar magnetron sputtering apparatus or system which is more adaptable in its operation in that one dopant may be readily replaced by another without disturbing the host target assembly. This is accomplished in accordance with the present invention by virtue of the use of separately disposed host and dopant materials rather than with the use of a doped target material.

To accomplish the foregoing and other objects of this invention there is provided a sputtering cathode apparatus for the deposition of a doped thin film on a substrate. The apparatus and system of the present invention is particularly useful in the deposition of doped thin films on large area substrates. The substrate typically moves over the sputtering cathode apparatus which is stationary. The apparatus of this invention comprises a planar magnetron sputtering means including means defining a frame-shaped plasma area and having a host target material disposed in the magnetron area. The host target material may comprise zinc sulfide. There is also provided a diode sputtering means disposed inside the framed area and thus outside of the plasma sputtering area. This diode-sputtering means comprises a dopant material in the form of a diode cathode. The dopant material may comprise manganese. Means are provided for electrically exciting both the host target material and the dopant material to provide for co-deposition of these materials. The means for electrically exciting the materials may comprise separate RF sources. For RF sputtering, co-excitation of the sources is desired to prevent beating of RF modes. The co-excitation assures that the sources will not be out of phase. The dopant level is controlled by the relative power fed to the respective host and dopant targets.

BRIEF DESCRIPTION OF THE DRAWINGS

Numerous other object features and advantages of the invention should now become apparent upon a reading of the following detailed description taken in conjunction with the accompanying drawing, in which:

FIG. 1 is a plan view of the sputtering cathode system of this invention illustrating the phosphor host target and dopant target;

FIG. 2 is a cross sectional view of the cathode system illustrated in FIG. 1 showing further details, particularly of the planar magnetron sputtering apparatus.

DESCRIPTION OF PREFERRED EMBODIMENT

Figure 3:
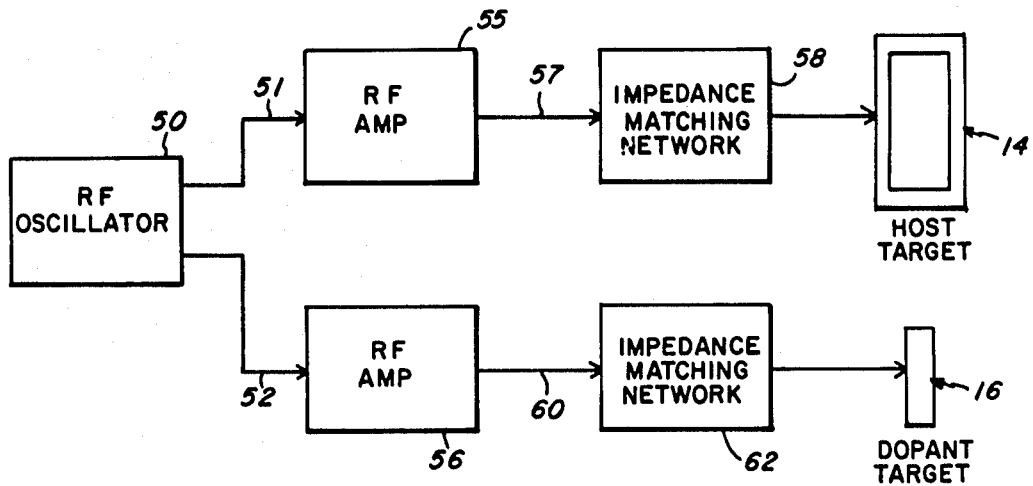
FIG. 3 is an electric circuit associated with the apparatus of FIGS. 1 and 2.

With reference to the drawings, and in particular FIGS. 1 and 2, there is shown a sputtering cathode apparatus for the deposition of a doped thin film on a substrate 10. The system or apparatus that is described includes a magnetron cathode for the host material which is preferrably sputtered at a relatively high rate for process efficiency in combination with a separate, electrically isolated, diode cathode for the dopant material. The substrate 10 is passed over the assembly in linear motion as indicated by the arrow 12 and at a sufficient rate to average the deposition of the host and dopant. In connection with the magnetron cathode, there is defined a plasma region from which sputtering takes place and which is in the shape shown in FIG. 1 in the form of rectangular-shaped picture frame with a rectangular region in the center from which no sputtering takes place. It is this center region that has disposed therein the electrically isolated diode cathode for the dopant material.

FIG. 1 illustrates the picture frame configuration of the phosphor host target 14 which is disposed in the magnetron plasma area illustrated between the permanent magnets shown in FIG. 2. As illustrated in FIG. 1 there is also provided a dopant target 16 which is outside the aforementioned magnetron plasma area in a central, rectangular-shaped area 18. FIG. 2 also illustrates the host target 14 and the dopant target 16 each being respectively excited from an RF source 24, 26. In FIG. 2 the connections from each RF source are shown schematically. Associated with each of these sources is a co-excitation device 22. In the case of RF sputtering, co-excitation of the power supplies used for the separate targets is desired to prevent the beating of RF modes. Further details of the circuitry are depicted in FIG. 3 and discussed in further detail hereinafter.

The host target material may comprise, for example, zinc sulfide. The dopant target material may, for example, comprise manganese. As indicated previously this substrate is passed by linear motion over the sputtering cathode system. The distance from the targets to the substrate illustrated by dimension d in FIG. 2 may be on the order of about 3 inches.

FIG. 2 also shows further details of the planar magnetron sputtering apparatus. This apparatus includes a support member 30 which may be constructed of magnetic stainless steel. This preferably has a form of water jacket 32. Cooling fluid is introduced into the support member 30 for the purpose of keeping it cool. A further support member 34 includes means for supporting a series of permanent magnets 36. FIG. 2 illustrates the manner in which the permanent magnets 36 are placed indicating north and south poles by the respective designations N and S. The support member 34 is preferably constructed of a nonmagnetic aluminum. It is noted that the plasma region is established basically between the permanent magnets such as in the area A designated in FIG. 2. The width of this area also corresponds with the width of the overlaying host target material 14.

A copper sheet 40 also essentially in a picture frame shape is supported over the planar magnetron sputtering means. There is also provided a thin copper plate 42 for support of the dopant material 16. The plates 40 and 42 are preferably provided in integral single piece construction with the plate separated by appropriate insulation layers 44. The copper plates 40 and 42 are made, for example, $\frac{1}{8}$-$\frac{1}{4}$ inch thick. These plates are nonmagnetic and provide good heat conduction to the support base 30.

As indicated previously, the magnetron cathode and diode cathodes are co-excited. FIG. 2 schematically illustrates this co-excitation. FIG. 3 gives some further circuit detail. In FIG. 3 there is shown an RF oscillator 50 which has output lines 51 and 52 coupling to the respective RF amplifiers 55 and 56. The RF amplifier 55 has an output line 57 and that couples to one impedance matching network 58. Similarly, the RF amplifier 56 has an output line 60 that couples to a second impedance matching network 62. Once again the RF oscillator 50 feeds signals to the RF amplifiers that are in phase so that the proper co-excitation occurs. In FIG. 3 the output of the impedance matching network is shown coupling to the host target 14 while the output of the impedance matching network 62 is shown coupling to the dopant target 60.

Having described a limited number of embodiments of the present invention, it should now be apparent to those skilled in the art that numerous other embodiments are contemplated as following within the scope of this invention. For example, one host target material and dopant material has been described herein but it is understood that the concepts of the invention may be applied in the deposition of other types of doped thin films. Also, in accordance with the invention the percentage of doping is readily controlled by controlling the gain of the RF amplifiers 55 and 56. The gain of the amplifers can be controlled separately so as to control dopant level. Also, in accordance with the invention the replacement of one dopant by another is affected quite easily by demounting the dopant backing plate with its target and simply replacing it. This can be accomplished quite quickly without disturbing the host target assembly.

We claim:

1. A sputtering cathode apparatus for deposition of a doped thin film on a substrate which is moved relative to said apparatus, comprising;
    planar magnetron sputtering means including means defining a frame-shaped plasma area and having a host target material disposed in the magnetron plasma area,
    diode sputtering means disposed inside said framed area and out of the plasma sputtering area and comprising a dopant material,
    and means for electrically exciting said host target material and dopant material to provide co-deposition of said materials therby forming the doped thin film on the substrate.

2. A sputtering cathode apparatus as set forth in claim 1 wherein said host target material comprises zinc sulfide.

3. A sputtering cathode apparatus as set forth in claim 1 wherein said dopant material comprises manganese.

4. A sputtering cathode apparatus as set forth in claim 1 wherein said planar magnetron sputtering means comprises permanent magnet means.

5. A sputtering cathode apparatus as set forth in claim 1 wherein said means for electrically exciting comprises circuit means for co-exciting the host and dopant materials.

6. A sputtering cathode apparatus as set forth in claim 5 wherein said co-excited respective signals for the host and dopant materials are maintained in phase.

7. A sputtering cathode apparatus as set forth in claim 6 wherein the circuit means comprises an RF oscillator, RF amplifier means coupled from the RF oscillator and impedance matching means coupled from the RF amplifier means to each material.

8. A sputtering cathode apparatus as set forth in claim 7 wherein the RF amplifier means gain is controlled to control percentage to doping in doped thin film.

9. A sputtering cathode apparatus as set forth in claim 1 including means for electrically isolating said planar magnetron sputtering means and said diode sputtering means.

* * * * *